United States Patent [19]
Takayama et al.

[11] Patent Number: 5,677,549
[45] Date of Patent: Oct. 14, 1997

[54] SEMICONDUCTOR DEVICE HAVING A PLURALITY OF CRYSTALLINE THIN FILM TRANSISTORS

[75] Inventors: Toru Takayama; Hongyong Zhang; Yasuhiko Takemura, all of Kanagawa, Japan

[73] Assignee: Semiconductor Energy Laboratory Co., Ltd., Kanagawa, Japan

[21] Appl. No.: 439,937

[22] Filed: May 12, 1995

Related U.S. Application Data

[62] Division of Ser. No. 207,173, Mar. 8, 1994, Pat. No. 5,624,831.

[30] Foreign Application Priority Data

Mar. 12, 1993 [JP] Japan ................................. 5-79001

[51] Int. Cl.⁶ .............................. H01L 29/04; H01L 29/76
[52] U.S. Cl. .......................... 257/66; 257/57; 257/64; 257/72; 257/75; 257/291
[58] Field of Search ................................ 257/57, 64, 66, 257/72, 75, 291, 350, 352, 607, 741, 746; 437/41

[56] References Cited

U.S. PATENT DOCUMENTS

| | | | |
|---|---|---|---|
| 4,571,486 | 2/1986 | Arai | 437/247 |
| 4,772,927 | 9/1988 | Saito et al. | 437/21 |
| 4,986,213 | 1/1991 | Yamazaki et al. | 118/719 |
| 5,147,826 | 9/1992 | Liu et al. | 437/233 |
| 5,156,914 | 10/1992 | Moslehi | 437/21 |
| 5,236,850 | 8/1993 | Zhang | 437/21 |
| 5,252,502 | 10/1993 | Havemann | 437/21 |
| 5,275,851 | 1/1994 | Fonash et al. | 427/578 |
| 5,328,861 | 7/1994 | Miyakawa | 437/247 |
| 5,352,291 | 10/1994 | Zhang et al. | 117/7 |
| 5,374,837 | 12/1994 | Uno | 257/350 |

OTHER PUBLICATIONS

"Crystallized Si Films By Low–Temperature Rapid Thermal Annealing Of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

C. Hayzelden et al., "In Situ Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

(List continued on next page.)

*Primary Examiner*—Carl W. Whitehead
*Attorney, Agent, or Firm*—Sixbey, Friedman, Leedom & Ferguson, P.C.; Gerald J. Ferguson, Jr.; Bradley D. Blanche

[57] ABSTRACT

A semiconductor circuit having a plurality of crystalline thin film transistors possessing different electrical characteristics which are formed on a substrate having an active matrix region and a driver circuit region. At least one first thin film transistor comprising a first crystalline silicon film is formed on the active matrix region of the substrate, while at least one second thin film transistor comprising a second crystalline silicon film is formed on the driver circuit region. The crystalline film of each of the first thin film transistors contains a catalyst element capable of promoting the crystallization of silicon at a higher concentration than the crystalline film of each of the second thin film transistors.

14 Claims, 3 Drawing Sheets

OTHER PUBLICATIONS

T. Hempel et al., "Needle–Like Crystallization of Ni Doped Amorphous Silicon Thin Films", *Solid State Communications*, vol. 85, No. 11, pp. 921–924, 1993.

Kawazu et al., "Initial Stage of the Interfacial Reaction Between Nickel and Hydrogenated Amorphous Silicon", Japanese Journal of Applied Physics, Apr. 1990, vol. 29, No. 4, pp. 729–738.

Kawazu et al., "Low–Temperature Crystallization of Hydrogenated Amorphous Silicon Induced by Nickel Silicide Formation", Japanese Journal of Applied Physics, Dec. 1990, vol. 29, No. 12, pp. 2968–704.

SEMICONDUCTOR DEVICE HAVING A PLURALITY OF CRYSTALLINE THIN FILM TRANSISTORS

This is a Divisional application of Ser. No. 08/207,173, filed Mar. 8, 1994 now U.S. Pat. No. 5,624,831.

BACKGROUND OF THE INVENTION

1. Field of the Invention

The present invention relates to a semiconductor circuit comprising a plurality of thin film transistors (abbreviated hereinafter as "TFTs"), and also to a process for fabricating the same. According to the fabrication process of the present invention, the TFTs are formed either on an insulator substrate such as a glass substrate or on a semiconductor substrate such as a single crystal silicon substrate. More particularly, the present invention relates to a semiconductor circuit comprising a low-speed operating matrix circuit, for example, a circuit suitable for use in liquid crystal displays, and a high-speed operating peripheral circuit for driving the matrix circuit.

2. Prior Art

Active study is now being made on semiconductor devices of insulated-gate type comprising an insulator substrate having thereon a thin film active layer (which is sometimes referred to as "active region"). In particular, much effort is paid on the study of insulated-gate transistors of thin film type, i.e., the so-called thin film transistors (TFTs). The TFTs are formed on a transparent insulator substrate, so that they can be employed mainly for controlling each of the pixels or in driver circuits of matrix-driven display devices. The TFTs can be classified into, for example, amorphous silicon TFTs and crystalline silicon TFTs, according to the material and the state of the semiconductor employed in the TFT.

In general, semiconductors in an amorphous state have a low electric field mobility. Accordingly, they cannot be used in TFTs in which high speed operation is required. The present day research and development is therefore devoted to crystalline silicon TFTs for use in the fabrication of high performance circuits.

In contrast to the amorphous semiconductors, crystalline semiconductors have higher electric field mobilities, and are therefore suitable for use in the high speed operation of TFTs. Crystalline silicon is further advantageous in that a CMOS circuit can be easily fabricated therefrom, because not only an NMOS TFT but also a PMOS TFT is available from crystalline silicon. Accordingly, there is proposed an active-matrix driven liquid crystal display having a so-called monolithic structure comprising crystalline TFTs in CMOS, not only in the active matrix portion but also in the peripheral circuit (such as the driver circuit) thereof.

FIG. 3 is the block diagram of a monolithic active matrix circuit for use in a liquid crystal display. Referring to FIG. 3, a peripheral driver circuit comprising a column decoder 1 and a row decoder 2 is provided on a substrate 7. Pixel circuits 4 each comprising a transistor and a capacitor are formed in a matrix region 3. The matrix region is connected to the peripheral circuit by interconnections 5 and 8. A high speed operation is required to the TFTs in the peripheral circuit, while the TFTs in the pixel circuit are required to have low leak current. These two characteristics are indeed in conflict with each other, but still, the two TFTs had to be formed on the same substrate.

However, the TFTs fabricated by a same process exhibit similar characteristics. For instance, crystalline silicon can be obtained by laser annealing, i.e., by a crystallization using laser. However, if the same crystalline silicon obtained by laser crystallization is used in a TFT for a matrix region and in that for a peripheral driver circuit, the both TFTs yield similar properties. One may think therefore of crystallizing the silicon for the TFT of the matrix region by thermal crystallization, and employing laser crystallization for that of the peripheral driver circuit. However, thermal crystallization requires performing annealing at 600° C. for a duration as long as 24 hours or even longer, or at a temperature as high as 1,000° C. or higher. The former treatment considerably lowers the throughput, and the latter process cannot be applied to cases in which substrates other than those made of quartz is used.

The present invention aims to overcome the aforementioned difficulties in the fabrication of a semiconductor circuit. However, the process should not be a complicated one nor a one which accompanies low product yield or an increase in product cost. An object of the present invention is to easily provide two types of TFTs, i.e., a TFT having high mobility and a TFT having a low leak current, by incorporating minimum process modifications. In this manner, two types of TFTs can be readily fabricated by a process suitable for mass production.

SUMMARY OF THE INVENTION

As a result of an extensive study of the present inventors, it has been found that the crystallization of a substantially amorphous silicon film can be accelerated by adding a trace amount of a catalytic material. In this manner, the crystallization can be effected at a lower temperature and in a shorter duration of time. Preferred catalytic materials include pure metals, i.e., nickel (Ni), iron (Fe), cobalt (Co), and platinum (Pt), or a compound such as a silicide thereof. The process according to the present invention more specifically comprises forming, over or under the amorphous silicon film and furthermore in contact therewith, a material containing the catalytic elements in the form of a film, particles, clusters, etc., and thermally annealing the thus formed material for crystallization at a proper temperature, typically at 580° C. or lower. Otherwise, instead of forming the material containing the catalytic element in contact with the amorphous silicon film, the catalytic element may be incorporated into the amorphous silicon film by a means such as ion implantation.

When the amorphous silicon film is formed by chemical vapor deposition (CVD), the catalytic element may be added into the starting gas material. If a physical vapor deposition process such as sputtering is used for the formation of the amorphous silicon film, the catalytic material may be added into the film deposition material such as the target and the evaporation source. As a matter of course, the duration of crystallization can be shortened by increasing the annealing temperature. Furthermore, the duration of crystallization becomes shorter and the crystallization temperature becomes lower with increasing concentration of nickel, iron, cobalt, or platinum. The present inventors have found, through extensive study, that the crystallization is accelerated by incorporating at least one of the catalytic elements above at a concentration of $1 \times 10^{17}$ cm$^{-3}$ or higher, and preferably, at a concentration of $5 \times 10^{18}$ or higher.

The catalytic materials enumerated above, however, are not favorable for silicon. Accordingly, the concentration thereof are preferably controlled to a level as low as possible. The present inventors have found through the study that the preferred range of the concentration in total is $1 \times 10^{20}$ cm$^{-3}$ or lower.

More noticeably, the process according to the present invention can maintain the portions in an amorphous state during the crystallization of the desired portions into which the catalytic material is added. For instance, an amorphous silicon containing no additional catalytic element, i.e., an amorphous silicon containing the catalytic material above typically at a concentration of $1 \times 10^{17}$ cm$^{-3}$ or lower, and preferably, at a concentration of $1 \times 10^{16}$ cm$^{-3}$ or lower, crystallizes at a temperature of 600° C. or higher. However, no crystallization occurs at a temperature 580° C. or lower. Only the desorption of hydrogen for neutralizing dangling bonds in the amorphous silicon occurs under an atmosphere of 300° C. or higher.

DETAILED DESCRIPTION OF THE INVENTION

Figure 1A:
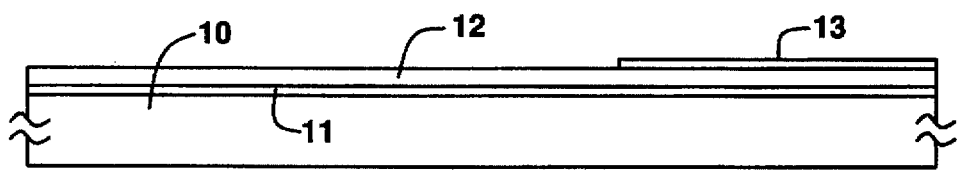
FIGS. 1(A) to 1(E) show schematically drawn step sequential cross section structures obtained in a process according to an embodiment of the present invention (Example 1)
Figure 1B:
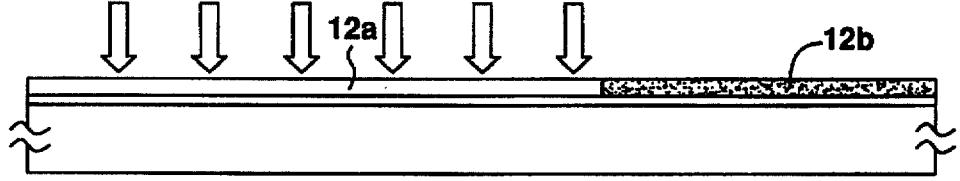

The process according to the present invention utilizes the effect of catalytic materials on the crystallization of amorphous silicon film. More specifically, the process according to the present invention comprises selectively crystallizing a part of a deposited amorphous silicon film to use this particular part for TFTs of low leak current to construct therefrom a pixel circuit for an active matrix circuit, and then crystallizing the rest of the amorphous portions by laser annealing to use it for high speed TFTs to provide the peripheral driver circuit. In this manner, a circuit comprising different types of TFTs, each sufficing conflicting requirements, is formed simultaneously on a single substrate.

A key in the present invention is to prevent the catalytic elements from being incorporated into the portions designated for laser crystallization. Amorphous silicon containing a catalytic element undergoes crystallization. However, the properties (such as mobility) of a silicon film once crystallized cannot be further ameliorated by irradiating a laser beam. This signifies, more importantly, that the region once crystallized by the aid of a catalytic element retains the characteristics upon laser irradiation. In other words, selective laser irradiation is not necessarily required.

It is not preferred to distribute the catalytic element on the entire surface of the amorphous silicon film. Considering a case of performing first the step of thermal crystallization and then that of laser crystallization on an amorphous silicon film having the catalytic elements on the entire surface thereof, it can be understood from the foregoing description that no improvement in the silicon film quality can be expected.

One might then consider another process comprising the step of selective laser crystallization prior to that of thermal crystallization. The step of laser crystallization requires heating the amorphous silicon film at a temperature of 350° C. or higher, preferably at 450° C. or higher to drive excess hydrogen out of the amorphous silicon film. A heat treatment at such a low temperature, however, induces fine crystallization and impairs the effect of laser crystallization. It can be seen from the foregoing discussion, catalytic materials must not be included in the portion designated to laser crystallization.

Furthermore, the process according to the present invention is advantageous in that it comprises first the step of thermal crystallization. Hydrogen can be driven out of the region for laser crystallization during this step, and the entire process can be shortened.

The present invention is illustrated in greater detail referring to non-limiting examples below. It should be understood, however, that the present invention is not to be construed as being limited thereto.

EXAMPLE 1

FIG. 1 shows the cross section view of the step sequential structures obtained by a process according to an embodiment of the present invention. Referring to FIG. 1, a 2,000 Å thick silicon oxide film was formed by sputtering as a base film 11 on a Corning #7059 glass substrate 10. Then, an intrinsic (I-type) amorphous silicon film was deposited thereon by plasma CVD to a thickness of from 500 to 1,500 Å, for example, to a thickness of 1,500 Å in this case. Subsequently, a film 13 of nickel silicide (expressed by the chemical formula NiSi$_x$, where x is in the range of from 0.4 to 2.0; specifically in this case, x is 2.0) was deposited on the selected portions of the amorphous silicon film by sputtering at a thickness of from 5 to 200 Å, for example in this case, at a thickness of 20 Å. The resulting structure is shown in FIG. 1(A).

The structure thus obtained was subjected to annealing for the crystallization of the amorphous silicon film. The annealing was performed under a reducing atmosphere for a duration of 4 hours at a temperature of 500° C. In this manner, a crystalline silicon film 12b was obtained from the amorphous silicon film located at the lower side of the nickel silicide film 13. The portions 12a of the amorphous silicon film having no nickel silicide film thereon were remained in an amorphous state. Thus, laser beam was irradiated selectively to the amorphous portions to effect the crystallization thereof.

Figure 3:
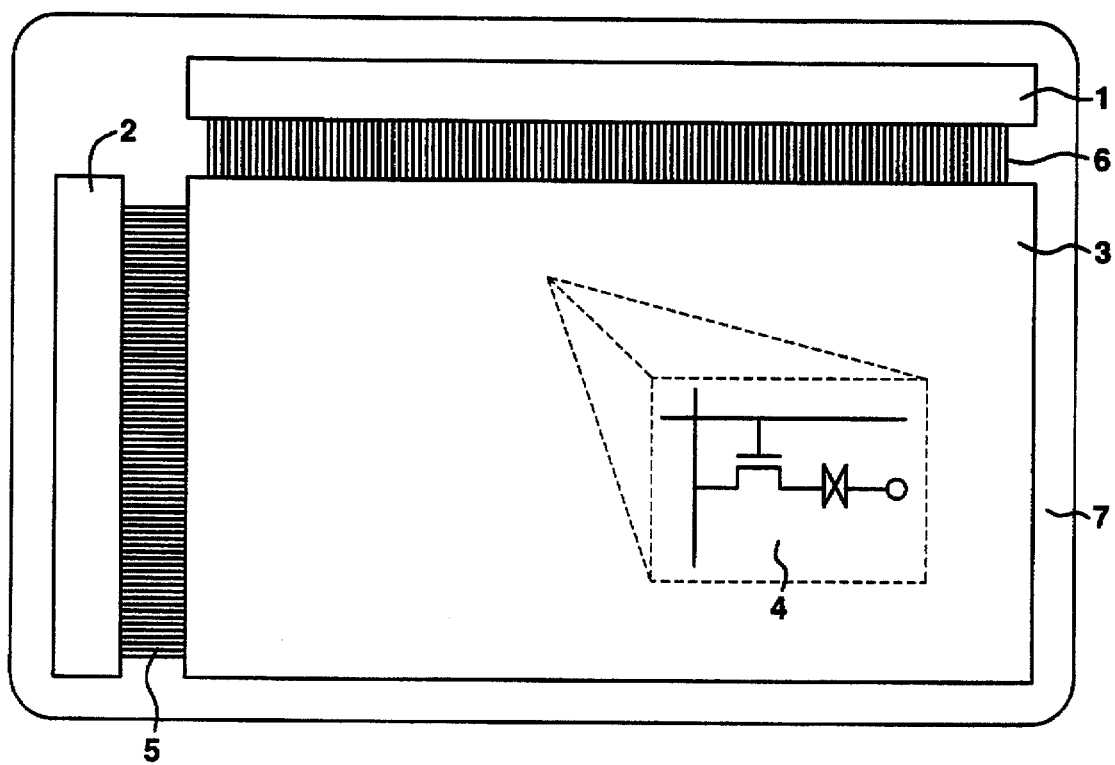
FIG. 3 shows an example of the constitution of a monolithic active matrix circuit.

The laser used in this case was a KrF excimer laser operating at a wavelength of 248 nm and a pulse width of 20 nsec. However, other lasers, such as a XeF excimer laser operating at a wavelength of 353 nm, a XeCl excimer laser operating at a wavelength of 308 nm, and an ArF excimer laser operating at a wavelength of 193 nm, may be used as well. The laser beam was applied at an energy density of from 200 to 500 mJ/cm$^2$, for example, at 350 mJ/cm$^2$, and from 2 to 10 shots, for instance, 2 shots. per site. The substrate was heated to a temperature in the range of from 200° to 450° C., at 400° C. for example, during the laser irradiation. Since the region to be subjected to laser crystallization (i.e., the region designated for peripheral circuit) is located distant from the region to be thermally crystallized (i.e., the region for the matrix portion), as shown in FIG. 3, no particular step of photolithography was necessary. Furthermore, no degradation occurred on the thermally crystallized region upon laser irradiation. Thus was obtained a structure shown in FIG. 1(B).

Figure 1C:
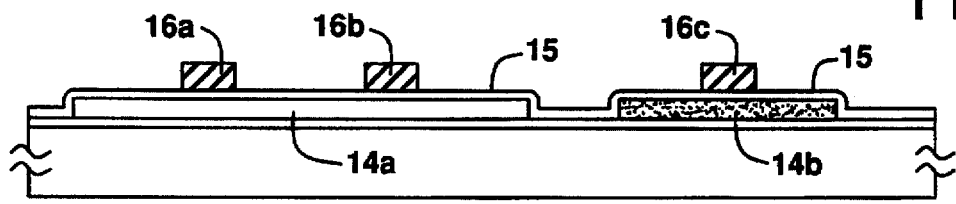

The silicon film thus obtained was patterned by photolithography to form an island-like silicon region 14a for the peripheral driver circuit and another island-like silicon region 14b designated for the matrix region. Then, a 1,000 Å thick silicon oxide film 15 was deposited thereon by sputtering to give a gate insulating film. The sputtering was performed using silicon oxide as the target, and under a mixed gas atmosphere containing argon and oxygen at an argon to oxygen ratio of 0.5 or lower, specifically, at a ratio of 0.1 or lower, while heating the substrate to a temperature in the range of from 200° to 400° C., for example, at 350° C. Subsequently, a silicon film containing from 0.1 to 2% of phosphorus was deposited by low pressure CVD at a thickness of from 6,000 to 8,000 Å, for example, at a thickness of 6,000 Å. Preferably, the silicon oxide film and the silicon film are deposited continuously. Then, the resulting silicon film was patterned to form gate electrodes 16a, 16b, and 16c as shown in FIG. 1(C).

Figure 1D:
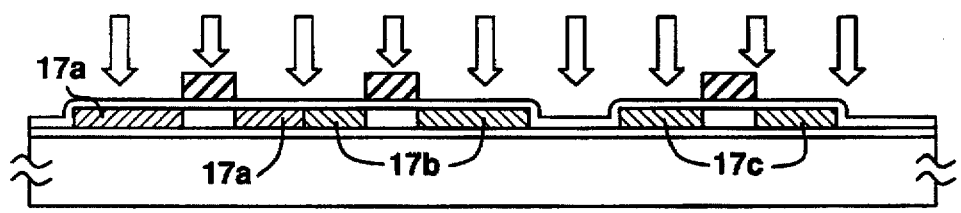

Phosphorus and boron as impurities were implanted thereafter by plasma doping into the silicon region using the gate electrode as a mask. Phosphorus can be implanted by using phosphine ($PH_3$) as the doping gas and applying an accelerating voltage in the range of from 80 to 90 kV for example, at 80 kV. Boron can be implanted by using diborane ($B_2H_6$) as the doping gas, and applying an accelerating voltage in the range of from 40 to 80 kV, for example, at 65 kV. The impurities are introduced at a dose of from $1\times10^{15}$ to $8\times10^{15}$ $cm^{-2}$, specifically for example, at a dose of $2\times10^{15}$ $cm^{-2}$ in case of phosphorus, and at $5\times10^{15}$ $cm^{-2}$ in case of boron. In this manner, an N-type impurity region 17a and a P-type impurity regions 17b and 17c were obtained as shown in FIG. 1(D).

Then, the implanted impurities were activated by laser annealing. The laser beam was irradiated also to the boundary portion of the impurity region to sufficiently effect the activation. The laser used in this case was a KrF excimer laser operated at a wavelength of 248 nm and a pulse width of 20 nsec. However, other lasers, such as a XeF excimer laser operating at a wavelength of 353 nm, a XeCl excimer laser operating at a wavelength of 308 nm, and an ArF excimer laser operating at a wavelength of 193 nm, may be used as well. The laser beam was applied at an energy density of from 200 to 400 $mJ/cm^2$ on the irradiated surface, for example, at 250 $mJ/cm^2$, and from 2 to 10 shots, for example 2 shots, per site. The substrate may be heated during the laser irradiation to a temperature in the range of from 200° to 450° C. Thus were the impurity regions 17a to 17c activated.

Figure 1E:
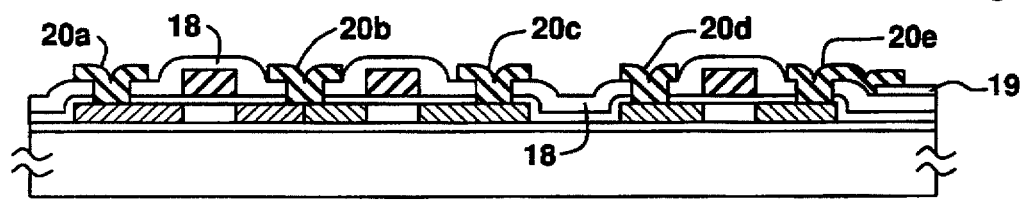

Subsequent to the step of laser annealing, a silicon oxide film 18 was deposited by plasma CVD as an interlayer insulator to a thickness of 6,000 Å. Furthermore, an indium tin oxide (ITO) film was deposited by sputtering to a thickness of from 500 to 1,500 Å, for example, to 800 Å. The ITO film thus deposited was patterned to provide an ITO pixel electrode 19. Then, contact holes were provided in the interlayer insulator to form electrodes with interconnections 20a, 20b, 20c for the TFT of the peripheral driver circuit, and the same 20d and 20e for the TFT of the matrix pixel circuit, using a multilayered film comprising metallic materials, such as titanium nitride and aluminum. The resulting structure was subjected to annealing in hydrogen atmosphere for a duration of 30 minutes under a pressure of 1 atm and a temperature of 350° C. Thus was implemented a semiconductor circuit as shown in FIG. 1(E).

The nickel concentration of the active regions of the TFTs thus obtained were measured by means of secondary ion mass spectroscopy (SIMS). The pixel region was found to contain nickel at a concentration of from $1\times10^{18}$ to $5\times10^{18}$ $cm^{-3}$. This was in clear contrast with the concentration of the peripheral driver circuit region, which was below the detection limit of $1\times10^{16}$ $cm^{-3}$.

EXAMPLE 2

FIG. 2 shows the cross section view of the step sequential structures obtained by a process according to another embodiment of the present invention. Referring to FIG. 2, a 2,000 Å thick silicon oxide film 22 was formed by sputtering as a base film on a Corning #7059 glass substrate 21. Then, an amorphous silicon film 23 was deposited thereon by plasma CVD to a thickness of from 200 to 1,500 Å, for example, to a thickness of 500 Å in this case. Subsequently, nickel ions were implanted by ion implantation into selected portions of the amorphous silicon film 23 by masking the desired portions of the amorphous silicon film using a photoresist 24. In this manner was established a region 25 containing nickel at a concentration of $1\times10^{18}$ to $2\times10^{19}$ $cm^{-3}$, for example, at a concentration of $5\times10^{18}$ $cm^{-3}$. This region was provided at a depth of from 200 to 500 Å, and hence, the accelerating energy was selected accordingly. The resulting structure is shown in FIG. 2(A).

The amorphous silicon film was then crystallized under a reducing atmosphere by annealing at 500° C. for 4 hours. Thus was obtained a crystallized region from the region 23b into which nickel was implanted. In contrast, the region 23a into which no nickel was implanted remained amorphous. Then, laser beam was irradiated to the portion remained amorphous for the crystallization thereof.

Figure 2A:
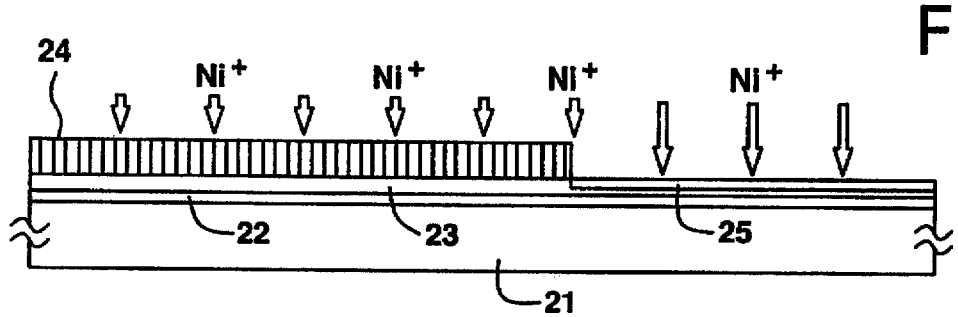
FIGS. 2(A) to 2(E) show schematically drawn step sequential cross section structures obtained in another process according to another embodiment of the present invention (Example 2)
Figure 2B:
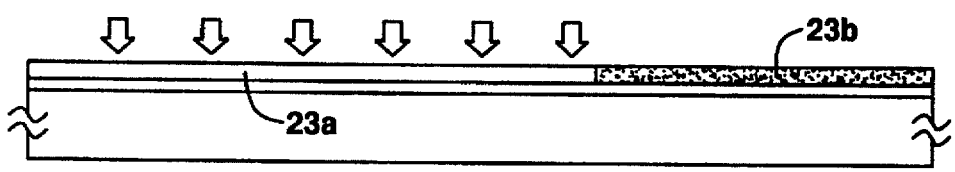

The laser used in this case was a KrF excimer laser operating at a wavelength of 248 nm and a pulse width of 20 nsec. The laser beam was applied at an energy density of from 200 to 500 $mJ/cm^2$, for example, at 350 $mJ/cm^2$, and from 2 to 10 shots for example 2 shots, per site. The substrate may be heated during the laser irradiation at a temperature in the range of from 200° to 450° C., for example, at 400° C. Thus was obtained a structure as shown in FIG. 2(B).

The resulting silicon film was patterned to form an island-like silicon region 26a for the peripheral driver circuit and another island-like silicon region 26b designated for the matrix region. Then, a 1,000 Å thick silicon oxide film 27 was deposited thereon as a gate insulating film for the TFT, by plasma CVD using tetraethoxysilane ($Si(OC_2H_5)_4$) (TEOS) and oxygen as the starting material. Furthermore, trichloroethylene ($C_2HCl_3$) was added into the starting material for the plasma CVD. In performing the step of plasma CVD, oxygen was first supplied to the deposition chamber at a rate of 400 sccm (standard cubic centimeters per minute), and plasma was generated thereafter under a total pressure of 5 Pa and an RF power of 150 W, while maintaining the substrate temperature to 300° C. The plasma thus generated was kept in this state for 10 minutes. The film was then deposited after supplying oxygen, TEOS, and trichloroethylene at a rate of 300 sccm, 15 sccm, and 2 sccm, respectively. During the process, the substrate temperature, RF power, and the total pressure were maintained at 300° C., 75 W, and 5 Pa, respectively. Upon completion of the film deposition, hydrogen was supplied into the chamber at a pressure of 100 Torr to effect hydrogen annealing at 350° C. for a duration of 35 minutes.

Figure 2C:
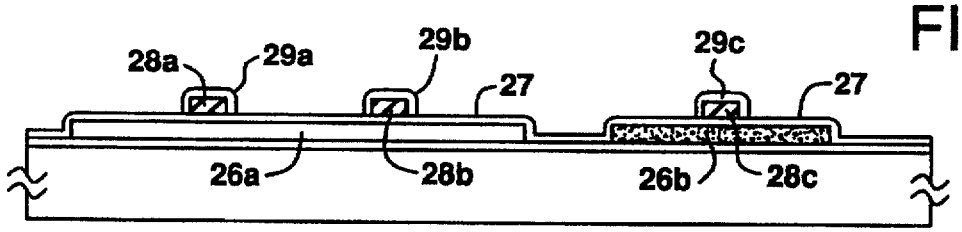

Subsequently, an aluminum film containing 2% of silicon was deposited by sputtering to a thickness of from 6,000 to 8,000 Å, more specifically, for example, for a thickness of 6,000 Å. Tantalum, tungsten, titanium, or molybdenum can be used in the place of aluminum. Preferably, the silicon oxide film 27 and the silicon film are deposited continuously. Then, the resulting aluminum film was patterned to form gate electrodes 28a, 28b, and 28c, and the surface of the resulting aluminum interconnection was anodically oxidized to form oxide layers 29a, 29b, and 29c. The anodic oxidation was performed in an ethylene glycol solution containing from 1 to 5% tartaric acid. The oxide layer thus obtained as shown in FIG. 2(C) was found to have a thickness of 2,000 Å.

Then, phosphorus as an impurity was implanted by plasma doping into the silicon region. Phosphorus was implanted by using phosphine ($PH_3$) as the doping gas, and applying an accelerating voltage in the range of from 60 to 90 kV, for example, at 80 kV. Phosphorus was introduced at a dose of from $1 \times 10^{15}$ to $8 \times 10^{15}$ $cm^{-2}$, specifically for example, at a dose of $2 \times 10^{15}$ $cm^{-2}$. Thus was obtained an N-type impurity region 30a. Subsequently, the TFT on the left hand side (i.e., the N-channel TFT) was masked using a photoresist, and boron as an impurity was implanted, by means of plasma doping again, into the TFT (P-channel TFT) of the peripheral driver region located on the right hand side and the silicone region of the TFT of the matrix region. Boron was implanted by using diborane ($B_2H_6$) as the doping gas, and applying an accelerating voltage in the range of from 50 to 80 kV, for example, at 65 kV. The dose thereof was from $1 \times 10^{15}$ to $8 \times 10^{15}$ $cm^{-2}$, specifically in this case, at a value higher than that of phosphorus, i.e., $5 \times 10^{15}$ $cm^{-2}$. Thus was obtained P-type impurity regions 30b and 30c.

Figure 2D:
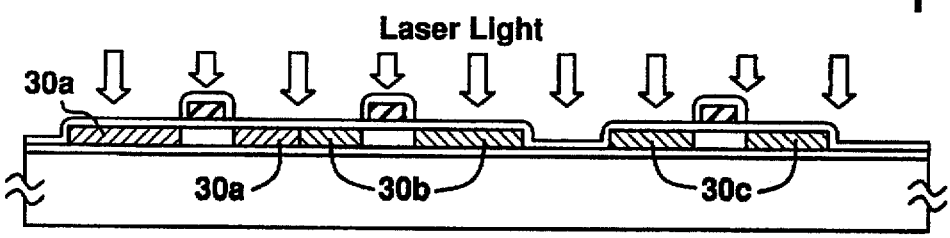

Then, the implanted impurity was activated by laser annealing. The laser used in this case was a KrF excimer laser operated at a wavelength of 248 nm and a pulse width of 20 nsec. The laser beam was applied at an energy density of from 200 to 400 $mJ/cm^2$, for example, at 250 $mJ/cm^2$, and from 2 to 10 shots, for example 2 shots, per site. Thus was obtained a structure as shown in FIG. 2(D).

A 2,000 Å thick silicon oxide film 31 was deposited thereon as an interlayer insulator film by plasma CVD using tetraethoxysilane (TEOS), and an indium tin oxide (ITO) film was further deposited thereon by sputtering at a thickness of from 500 to 1,000 Å, for example, at a thickness of 800 Å. The resulting structure was subjected to etching to form a pixel electrode 32. Then, contact holes were provided in the interlayer insulator to ford source and drain electrodes with interconnections 33a, 33b, 33c for the TFT of the peripheral driver circuit, and the same 33d and 33e for the TFT of the matrix pixel circuit, using a multilayered film comprising metallic materials, such as titanium nitride and aluminum.

Figure 2E:
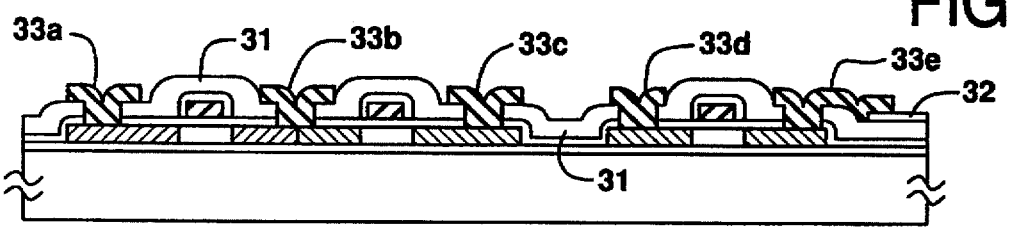

Thus was obtained a complete semiconductor circuit as shown in FIG. 2(E).

The semiconductor circuit thus obtained comprised TFTs in the peripheral driver circuit region, which were found to yield characteristics well comparable to those of the TFTs fabricated by a prior art laser crystallization technology. For instance, the shift resistor fabricated by an embodiment according to the present invention was confirmed to operate at 11 MMz at a drain voltage of 15 V, and at 16 MHz at a voltage of 17 V. Reliability tests revealed that they were as reliable as any obtained by a conventional technology. Concerning the TFT (pixel circuit) of the matrix region, the leak current thereof was found to be as low as $10^{-13}$ A or lower.

As described in the foregoing, the present invention provides, on a same single substrate, a crystalline silicon TFT capable of high speed operation and an amorphous silicon TFT characterized by its low leak current. The use of such a circuit in liquid crystal displays considerably increases the efficiency of mass production and the performance of the product.

The present invention enables crystallization of silicon at a temperature as low as 500° C. and at a duration as short as 4 hours, yet increasing the throughput. Furthermore, the present invention provides a solution to the problems of the prior art technologies; the crystallization effected at such a low temperature above prevents shrinking and warping from occurring on glass substrates, since the deformation of glass substrates had been encountered as serious problems in high temperature processes performed at 600° C. or higher.

The advantages of the present invention enumerated above also enables treating of large area substrates at a time. More specifically, a plurality of semiconductor circuits (such as matrix circuits) can be cut out from a large area substrate. Accordingly, the unit cost of the circuits can be considerably lowered. It can be seen from the foregoing that the present invention is of great use in the industry.

While the invention has been described in detail and with reference to specific embodiments thereof, it will be apparent to one skilled in the art that various changes and modifications can be made therein without departing from the spirit and scope thereof.

What is claimed is:

1. An active matrix device comprising:

a substrate having an active matrix region and a driver circuit region;

a first plurality of thin film transistors formed on said active matrix region of the substrate, each of said transistors having a crystalline semiconductor film comprising silicon as an active region; and a second plurality of thin film transistors formed on said driver circuit region, each of said transistors having a crystalline semiconductor film comprising silicon as an active region, wherein the crystalline semiconductor film of each of said first plurality of thin film transistors contains a catalyst element at a higher concentration than the crystalline semiconductor film of each of said second plurality of thin film transistors, said catalyst element capable of promoting a crystallization of silicon.

2. The active matrix device of claim 1 wherein the crystalline semiconductor film of each of said first plurality of thin film transistors contains said catalyst element at a concentration of $1 \times 10^{17}$ to $1 \times 10^{20}$ atoms/$cm^3$.

3. The active matrix device of claim 2 wherein said concentration is defined by a measurement of SIMS.

4. A semiconductor device comprising:

a substrate;

a first circuit comprising a p-channel thin film transistor and an n-channel thin film transistor formed on said substrate; and a second circuit comprising thin film transistors of only one of p-channel or n-channel types formed on said substrate, wherein each of said transistors of both said first and second circuits has a crystalline semiconductor film comprising silicon as an active region, and the thin film transistors of said second circuit contains a crystallization promoting material at a higher concentration than the thin film transistors of said first circuit.

5. The device of claim 4 wherein said p-channel thin film transistor and said n-channel thin film transistor form a CMOS device.

6. A semiconductor device comprising:

a substrate a first thin film transistor comprising a first crystalline silicon film formed on said substrate; and a second thin film transistor comprising a second crystalline silicon film formed on said substrate, wherein said first thin film transistor is doped with a catalyst metal which is capable of promoting a crystallization of said first crystalline silicon film while said second crystalline silicon film is not doped with said catalyst metal.

7. The semiconductor device of claim 6 wherein said first thin film transistor contains said catalyst element at a higher concentration than said second thin film transistor.

8. A semiconductor circuit comprising:

a monolithic circuit comprising an active matrix circuit and a peripheral driver circuit provided on a substrate, wherein an active region of a transistor provided in said active matrix circuit contains a catalytic element at a concentration of $1\times10^{17}$ cm$^{-3}$ or higher, and concentration of said catalytic element in an active region of a transistor provided in said peripheral driver circuit is lower than $1\times10^{17}$ cm$^{-3}$.

9. The circuit of claim 8 wherein said active region of the transistor provided in said active matrix circuit contains said catalytic element at a concentration of $5\times10^{18}$ cm$^{-3}$ or higher.

10. The circuit of claim 8 wherein said concentration of said catalytic element in the active region of the transistor provided in said peripheral driver circuit is lower than $1\times10^{16}$ cm$^{-3}$.

11. The circuit of claim 8 wherein said catalytic element is at least one element selected from the group consisting of nickel, iron, cobalt, and platinum.

12. The circuit of claim 8 wherein the concentration of the catalytic element is defined by a minimum value obtained by secondary ion mass spectroscopy.

13. The circuit of claim 11 wherein a total concentration of nickel, iron, cobalt, and platinum is $1\times10^{20}$ cm$^{-3}$ or lower in said active region of the transistor provided in said active matrix circuit.

14. A semiconductor circuit comprising:

a plurality of thin film transistors provided on a substrate, wherein an active region of a first one of said thin film transistors contains a catalytic element at a concentration of $1\times10^{17}$ cm$^{-3}$ or higher, and concentration of said catalytic element in an active region of a second one of said thin film transistors is lower than $1\times10^{17}$ cm$^{-3}$.

* * * * *